(12) United States Patent
Cheng et al.

(10) Patent No.: US 9,508,570 B2
(45) Date of Patent: Nov. 29, 2016

(54) SINGULATION APPARATUS AND METHOD

(71) Applicants: Chi Wah Cheng, Ysing Yi (HK); Eric Lap Kei Chow, Kowloon (HK); Joseph Hoi Shuen Tang, Kwai Chung (HK); Chun Kit Liu, Tsuen Wan N.T. (HK)

(72) Inventors: Chi Wah Cheng, Ysing Yi (HK); Eric Lap Kei Chow, Kowloon (HK); Joseph Hoi Shuen Tang, Kwai Chung (HK); Chun Kit Liu, Tsuen Wan N.T. (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 185 days.

(21) Appl. No.: 14/058,396

(22) Filed: Oct. 21, 2013

(65) Prior Publication Data

US 2015/0111366 A1 Apr. 23, 2015

(51) Int. Cl.
*H01L 21/67* (2006.01)
*B28D 5/02* (2006.01)
*H01L 21/687* (2006.01)

(52) U.S. Cl.
CPC ......... *H01L 21/67092* (2013.01); *B28D 5/024* (2013.01); *B28D 5/029* (2013.01); *H01L 21/68764* (2013.01)

(58) Field of Classification Search
CPC .. B28D 5/0005; B28D 5/0011; B28D 5/022; B28D 5/024; B28D 5/029; B28D 5/023; H01L 21/67092; H01L 21/68754
USPC ...................... 438/460–465; 225/2, 4, 93, 97
See application file for complete search history.

(56) References Cited

U.S. PATENT DOCUMENTS

| | | | | |
|---|---|---|---|---|
| 3,453,097 A * | 7/1969 | Hafner | .................. | B23K 26/18 219/121.67 |
| 4,688,540 A * | 8/1987 | Ono | ........................ | B27B 31/06 125/13.01 |
| 6,102,023 A * | 8/2000 | Ishiwata | ................ | B28D 5/024 125/13.01 |
| 6,345,616 B1 * | 2/2002 | Umahashi | ............ | B28D 5/0076 125/13.01 |
| 6,527,627 B2 * | 3/2003 | Arai | ...................... | B24B 41/068 451/41 |
| 6,606,985 B2 * | 8/2003 | Negishi | ..................... | B27B 5/32 125/13.01 |
| 6,726,526 B2 * | 4/2004 | Sekiya | ................. | B28D 5/0082 125/13.01 |
| 7,022,000 B2 * | 4/2006 | Mizomoto | ............ | B24B 37/345 451/288 |
| 7,129,150 B2 * | 10/2006 | Kawai | ................. | B23K 26/0057 257/E21.599 |
| 7,338,345 B2 * | 3/2008 | Fujinami | ................ | B28D 5/023 125/13.01 |
| 7,726,532 B2 * | 6/2010 | Gonoe | ............... | B23K 26/0736 225/1 |
| 8,116,893 B2 * | 2/2012 | Tsushima | ............... | B28D 5/029 382/145 |
| 8,231,431 B2 * | 7/2012 | Gajaria | ..................... | B24B 9/10 451/194 |
| 8,276,796 B2 * | 10/2012 | Nishisaka | .............. | B28D 1/222 225/93 |
| 8,431,428 B2 * | 4/2013 | Sekiya | ................. | B23K 26/367 219/121.61 |
| 2011/0179934 A1 * | 7/2011 | Soyama | ............... | B28D 5/0023 83/875 |
| 2013/0273717 A1 * | 10/2013 | Hwang | ............. | H01L 21/67092 438/463 |

FOREIGN PATENT DOCUMENTS

JP          2007-80897 A        3/2007

* cited by examiner

*Primary Examiner* — Jason Daniel Prone
*Assistant Examiner* — Richard Crosby, Jr.
(74) *Attorney, Agent, or Firm* — Ostrolenk Faber LLP

(57) ABSTRACT

A singulation apparatus and method including: at least one chuck station to which a workpiece is securable, the at least one chuck station being configured to move along a feed direction; a bridge extending above the at least one chuck station, the bridge having a first side and a second side opposite the first side; a first cutting device with members mounted to the bridge and being independently movable along the first side, transversely to the feed direction; and a second cutting device with members mounted to the bridge and being independently movable along the second side, transversely to the feed direction, the first and second cutting devices being configured and arranged for cutting the workpiece.

5 Claims, 8 Drawing Sheets

SINGULATION APPARATUS AND METHOD

TECHNICAL FIELD

The present disclosure relates to a singulation apparatus and method.

BACKGROUND

In the semiconductor industry, dicing machines are used for cutting semiconductor wafers or packaged semiconductor devices along a lattice of cutting lines. The cutting lines define boundaries between individual integrated circuit (IC) units. Dicing is also known as singulation or die cutting. A dicing machine includes a number of components including a chuck station, for holding a workpiece being cut, and a cutting means including a spindle and a blade rotatably mounted on the spindle.

As the unit size of IC units in a wafer or package strip becomes small (of the order of 1 mm or below), the IC unit count per unit area, as well as the number of cutlines, of the wafer or package strip is increased. Accordingly, a longer dicing time is needed for each wafer or package strip and the units per hour (UPH) of the dicing machine is decreased.

In previously proposed dicing machines, it has been attempted to increase the UPH by providing additional chuck tables or additional blades. For example, in Japanese publication no. JP2007080897A of DISCO Corporation, two chuck tables are provided. A dual cutting means is used to dice a wafer loaded to one of the chuck tables while a second wafer is aligned, loaded to the other chuck table and prepared for dicing.

Although this improves the efficiency of processing, there is still a bottleneck when the unit size is small. Wafers or package strips with small units on board require long cutting times, perhaps up to 3-5 minutes for each workpiece. On the other hand, the typical loading process for a workpiece takes 20-30 seconds. Accordingly, the loading process of the next workpiece is finished long before the cutting is finished for the current workpiece. The chuck station & loading mechanism can be idle for over 80% of the time, thus leading to inefficiency.

It would be desirable to provide a singulation apparatus and method which can efficiently handle wafers or packages with small unit size, or which at least provides a useful alternative.

SUMMARY

Embodiments relate to a singulation apparatus, comprising:
  at least one chuck station to which a workpiece is securable, the at least one chuck station being configured to move along a feed direction;
  a bridge extending above the at least one chuck station, the bridge having a first side and a second side opposite the first side;
  a first cutting device mounted to the bridge and being independently movable along the first side, transversely to the feed direction; and
  a second cutting device mounted to the bridge and being independently movable along the second side, transversely to the feed direction, the first and second cutting devices being operative to cut the workpiece.

Other embodiments relate to a singulation method, comprising the steps of:

providing at least one chuck station which is configured to move along a feed direction;
disposing a first cutting device on a first side of a bridge extending above the at least one chuck station;
disposing a second cutting device on a second side of the bridge opposite the first side, wherein the first and second sides of the bridge extend transversely to the feed direction;
securing a workpiece to at least one of the at least one chuck stations;
moving at least one of the first and second cutting devices along the respective side of the bridge; and
feeding the workpiece in the feed direction to at least one of the first and second cutting devices to cut the workpiece.

Advantageously, providing independently movable first and second cutting devices on opposite sides of the bridge allows multiple wafers to be processed at once by the singulation apparatus, whilst also giving the flexibility, if desired, to reconfigure the apparatus to apply special types of cut, such as bevel cuts and the like, with a single feed of a chuck station. In addition, by placing the cutting devices on opposite sides of the bridge, it is possible to arrange multiple chuck stations side-by-side with a reduced gap between adjacent pairs, thus reducing the footprint of the apparatus.

If multiple chuck stations are incorporated in the apparatus, then while cutting is performed on one workpiece by the cutting devices at one of the chuck stations, the next workpiece can be loaded to the other chuck station. Once cutting by the first cutting device is finished for the first chuck station, the first cutting device can begin moving to the other chuck station and start the cutting process on the next workpiece, while the second cutting device finishes cutting the first workpiece. This reduces idle time for the cutting devices which would otherwise occur when the next workpiece is being loaded.

BRIEF DESCRIPTION OF THE DRAWINGS

Embodiments of the invention will now be described, by way of non-limiting example only, with reference to the accompanying drawings in which.

DETAILED DESCRIPTION

Figure 1:
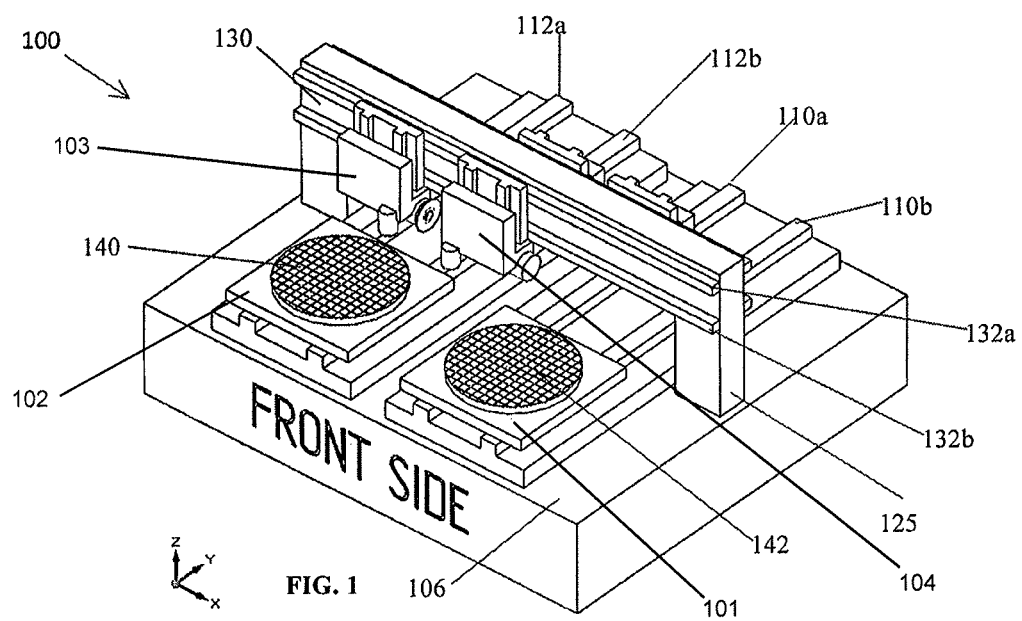
FIG. 1 is a front side perspective view of a dicing device with two chuck stations and four cutting members mounted on front and rear sides.
Figure 2:
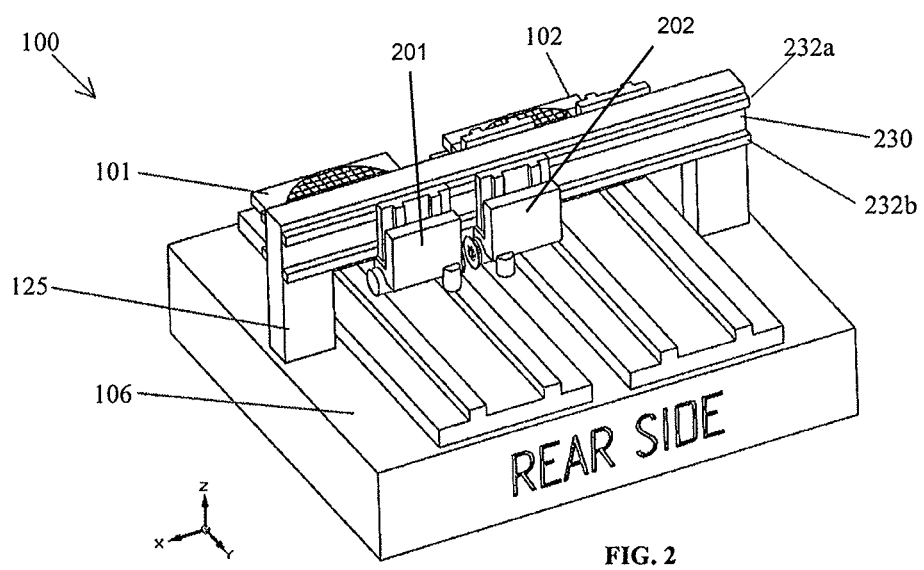
FIG. 2 is a rear side perspective view of the dicing device of FIG. 1.

Referring initially to FIG. 1 & FIG. 2, there is shown a dicing (or singulation) machine 100 with a chuck table 106 having two chuck stations 101, 102. The first chuck station 101 is captured to and travels along a pair of parallel rails 112a and 112b in a feed direction which is designated as Y. The second chuck station 102 is similar and is captured to and travels along a pair of parallel rails 110a and 110b in feed direction Y. The chuck stations 101, 102 are arranged side-by-side on the chuck table 106.

Extending above the chuck stations 101, 102 is a bridge 125 having a first side 130 and a second side 230 opposite the first side 130. A first pair of parallel rails 132a and 132b extends along the length of the first side 130 and a second pair of parallel rails 232a extends along the length of the second side 230. Mounted for movement along the rails 132a, 132b of the first side 130 is a first cutting device (shown in FIG. 1 as a pair of first cutting members 103 and 104) for cutting a workpiece.

Each first cutting member 103 or 104 comprises a base captured to rails 132a, 132b and a motorized platform mounted to the base for linear movement relative thereto in an up-and-down direction, i.e. the direction designated as Z in FIG. 1. The platform carries a motorized spindle, at one end of which is mounted a circular blade. The position of the platform in the Z-direction, and thus the height of the spindle, can be adjusted with precision by a controller (not shown) to control the depth of cut into a workpiece (shown in FIG. 1 as a wafer 140). The base is also motorized such that the position of the cutting member 103 or 104 can be adjusted along the rails 132a, 132b in the direction designated as X (i.e., transversely to the feed direction Y).

Each cutting member also includes at least one camera or other sensor fixed to the movable platform and facing towards the chuck table 106. The sensors are used for cutline recognition and alignment in a manner which is known in the art.

The spindles of the first cutting members 103 and 104 are arranged on the first side 130 such that their respective blades are facing towards each other. Accordingly, the distance between the respective blades can be adjusted to be very small, for example the distance between adjacent cutlines as shown in FIG. 8(a).

First cutting members 103 and 104 are independently movable along the first side 130 of the bridge 125, such that they can be positioned in order to dice a wafer positioned on either the first chuck table 101 or the second chuck table 102, for example.

A second cutting device (shown in FIG. 2 as second cutting members 201 and 202) is similar in construction to the first cutting members 103 and 104, but are disposed on the opposite side (second side) 230 of the bridge 125 for movement along parallel rails 232a, 232b (FIG. 2). The spindles of the pair of second cutting members 201, 202 are arranged such that their respective blades face each other, in similar fashion to the spindles of the first cutting members 103, 104 as shown in FIG. 8(a). By moving the pair of first cutting members 103, 104 and/or the pair of second cutting members 201, 202 to adjust a relative position between the first and second cutting devices, the workpiece 140 can be cut along the desired cutlines.

Because the two pairs of rails 132a, 132b and 232a, 232b are arranged in back-to-back manner onto a common bridge-like structure 125 above the dual chuck table 106, the first pair of cutting members 103, 104 can serve the first chuck table 101 while the second pair 201, 202 can serve the second (right) chuck table 102 and vice versa. If desired, both pairs of cutting means can serve the same chuck table (either the first chuck table 101 or the second chuck table 102). This can allow faster processing at the chuck table, since two extra cutlines can be applied in a single feed, or can allow special cuts such as bevel cuts to be made in a single feed as will later be described. When the workpiece 140 on the first chuck station is being cut, the next workpiece 142 can be loaded and cut on the second chuck station without interrupting the first chuck station, and thus production throughput is increased.

Figure 3:
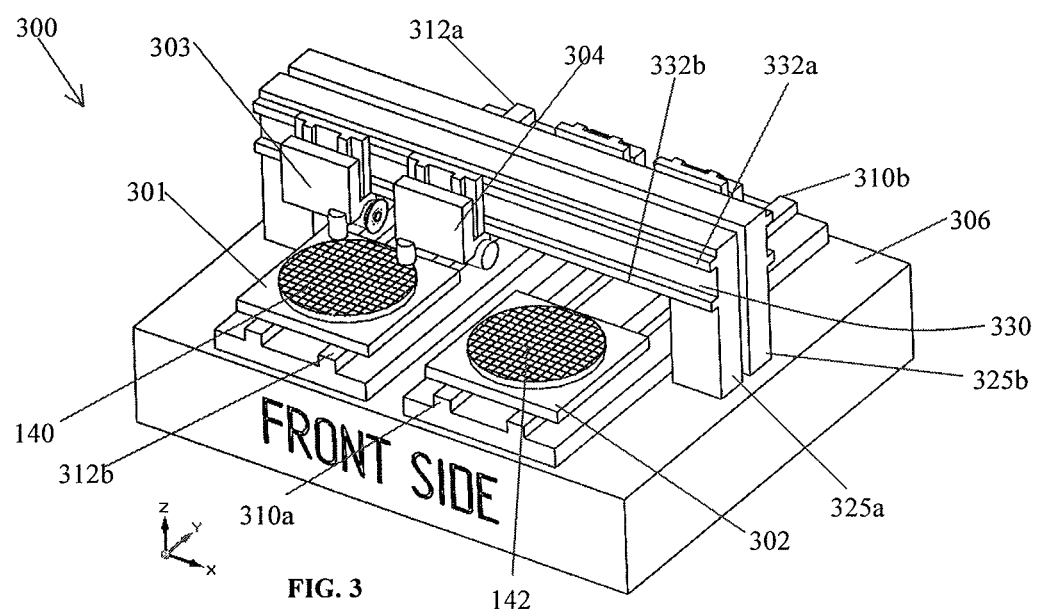
FIG. 3 is a front side perspective view of an alternative dicing device.
Figure 4:
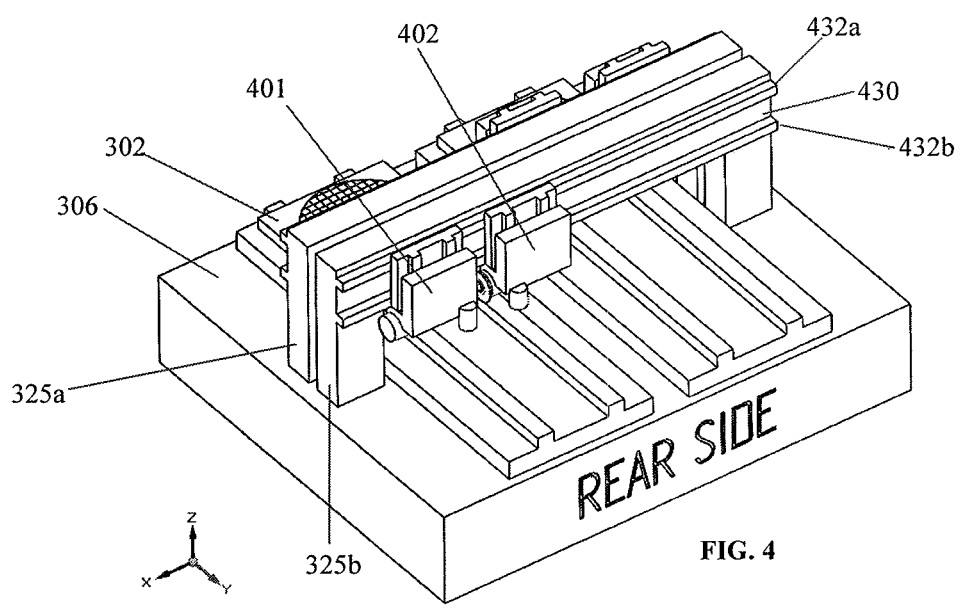
FIG. 4 is a rear side perspective view of the dicing device of FIG. 3.

An alternative embodiment of a dicing machine 300 is presented with reference to FIG. 3 & FIG. 4. The machine 300 as shown in FIG. 3 and FIG. 4 is of similar construction to that of FIG. 1 and FIG. 2, except that bridge 125 is replaced by a two-part bridge comprising a first bridge member 325a and a second bridge member 325b. The dicing machine 300 has two chuck stations, a first chuck station of which comprises a chuck table 301 which is captured to and travels along a pair of parallel rails 312a and 312b in feed direction Y, and a second chuck station of which comprises a chuck table 102 which is captured to and travels along a pair of parallel rails 310a and 310b, also in feed direction Y.

The dicing machine 300 has a first cutting device (shown in FIG. 3 as a pair of first cutting members 303 and 304), and a second cutting device (shown in FIG. 3 as a pair of second cutting members 401 and 402). Each first cutting member 303 or 304 comprises a motorized base captured to rails 332a, 332b of the first bridge member 325a which is on a first side 330 of the two-part bridge. The first cutting members 303, 304 are constructed substantially identically to the first cutting members 103, 104 of FIG. 1 and are arranged on the first side 330 such that their respective blades are facing towards each other. Similarly, the second cutting members 401 and 402 are disposed in blade-to-blade arrangement on the opposite side (second side) 430 of the two-part bridge on the second bridge member 325b for movement along parallel rails 432a, 432b.

The dicing machine 300 functions similarly to the dicing machine 100, but because of the physical separation between the respective rails of the bridge members 325a, 325b, has the further advantage that vibration on one side of the bridge induced by movement of cutting members on the opposite side is prevented or substantially reduced. This in turn means that the cutting quality is improved.

Figure 5:
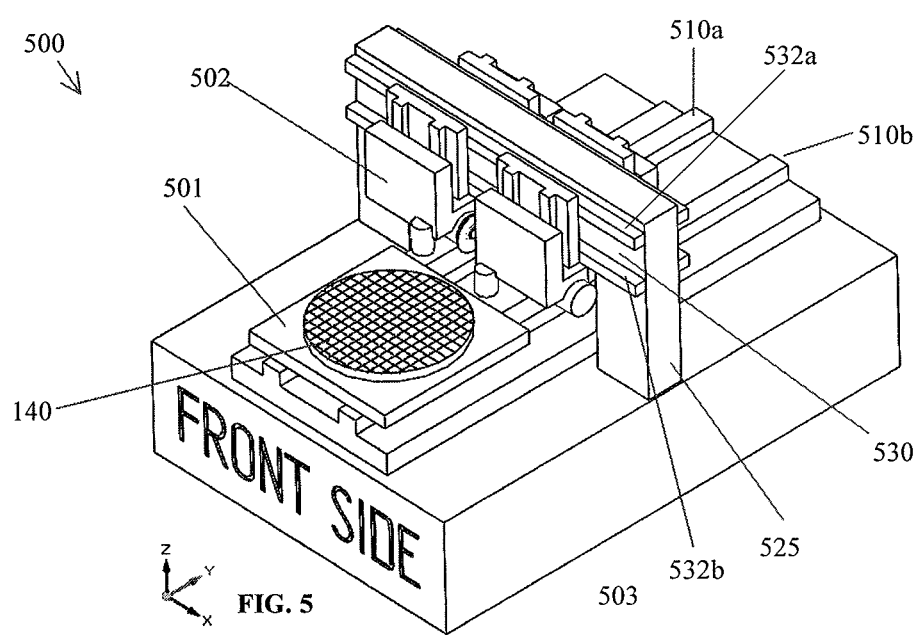
FIG. 5 is a front side perspective view of a further alternative dicing device with one chuck station and four cutting members mounted on front and rear sides.
Figure 6:
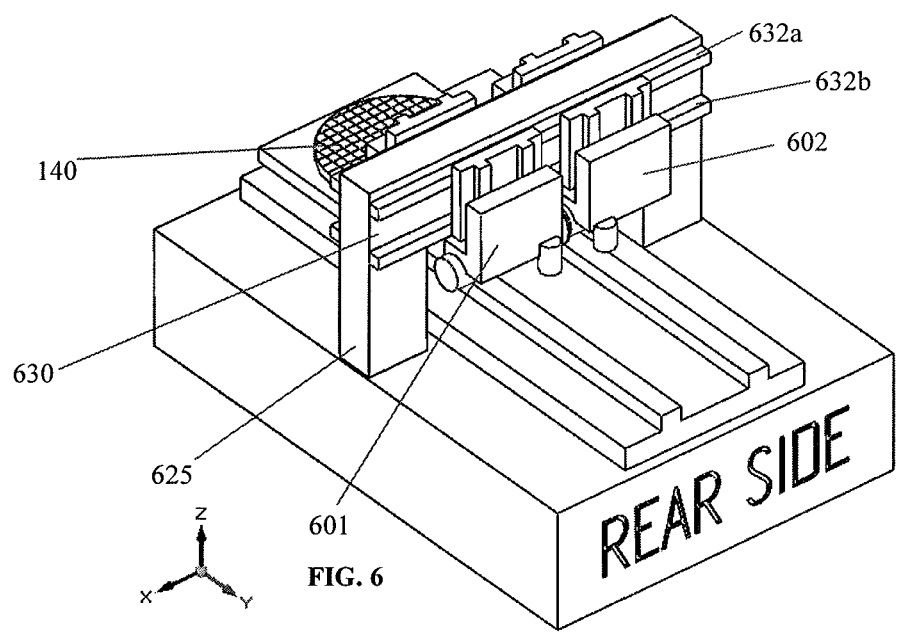
FIG. 6 is a rear side perspective view of the dicing device of FIG. 5.

Turning now to FIG. 5 and FIG. 6, there is shown a further embodiment of a dicing machine 500. The dicing machine 500 is similar to the dicing machine 100 but comprises only one motorized chuck station 501 which receives a wafer 140 for dicing. Four cutting members 502, 503 (mounted to rails 532a, 532b for travel in direction X, transverse to feed direction Y), 601 and 602 (mounted to rails 632a, 632b) are mounted in pairs on one bridge-like structure 525 (one pair in the front 530 and another pair at the back 630) to reduce the travel distance of the chuck station in direction Y. The total travel distance and time required to cut the work piece 140 are reduced such that production throughput is increased. It should be appreciated that the bridge-like structure 525 may also be replaced by the two-part bridge as shown in FIGS. 3 and 4.

Certain embodiments also relate to cutting methods which aim to improve production efficiency, as will now be described.

Figure 7:
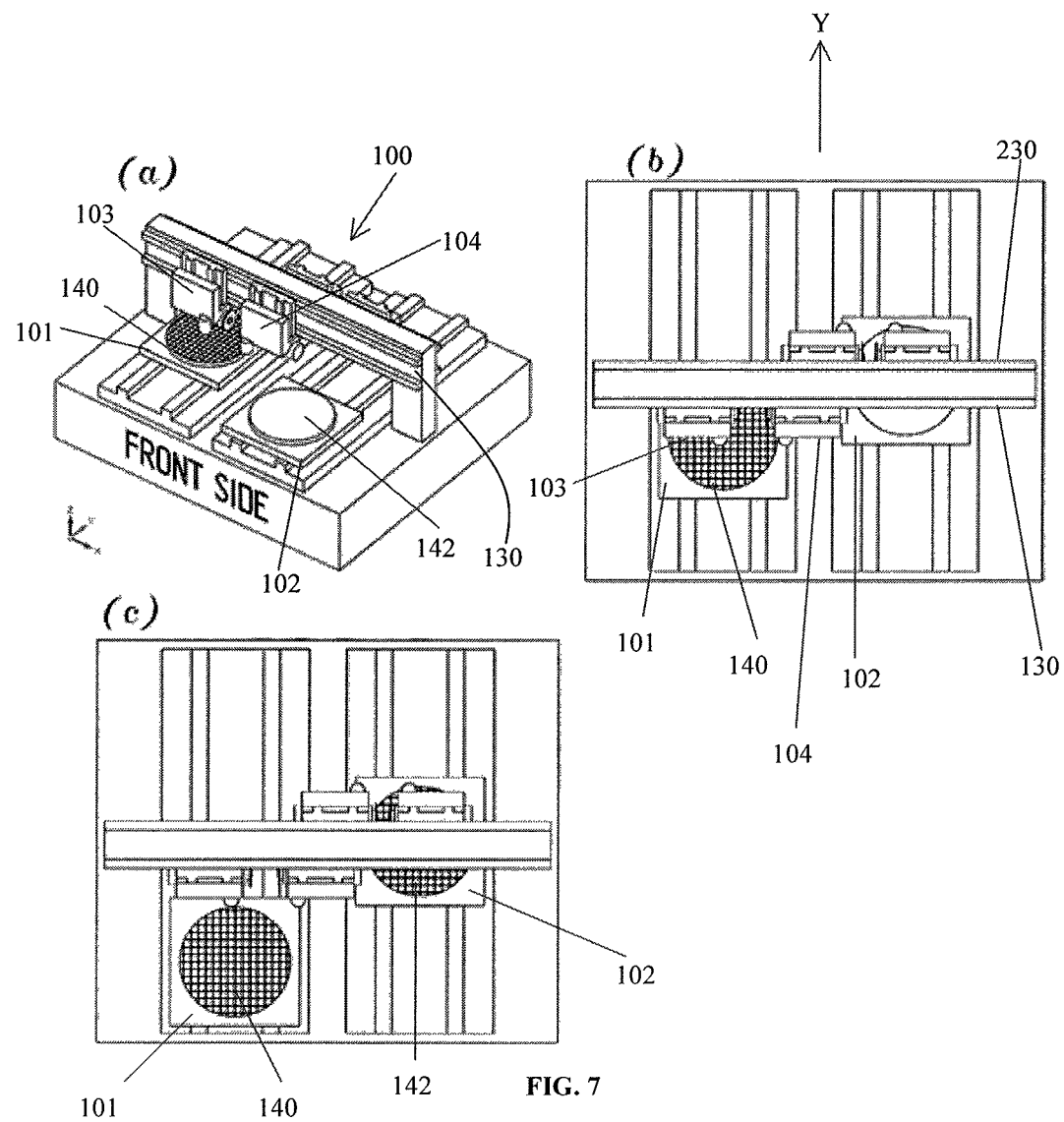
FIG. 7 schematically depicts a cutting method using a quad cutting means and dual chuck station.

A cutting method using a quad cutting means and dual chuck table is illustrated in FIG. 7.

In FIG. 7(a) a workpiece 140 is loaded and secured to the chuck station 101, before the chuck station 101 moves in the Y-direction and is fed under the two cutting means 103, 104 on the front side 130 for cutline recognition, alignment and dicing. While the alignment and cutting processes are being performed for the workpiece 140 on chuck station 101, the next workpiece 142 is loaded to the chuck station 102.

In FIG. 7(b) the chuck station 102 goes under the two cutting means 201, 202 on the rear side 230 for alignment and cutting.

In FIG. 7(c), after the cutting of the workpiece 140 on the chuck station 101 is finished, while cutting on the chuck station 102 continues, the chuck station 101 moves to the front side 130. The finished workpiece 140 is unloaded and the next workpiece (not shown) is loaded to chuck station 101.

As seen in FIG. 7, the positions of the respective pairs of the cutting means 103, 104 and 201, 202 may overlap during processing of the respective substrates 140, 142.

Accordingly, parallel processing of the workpieces 140, 142 is possible whilst minimizing the footprint of the machine 100.

Figure 8:
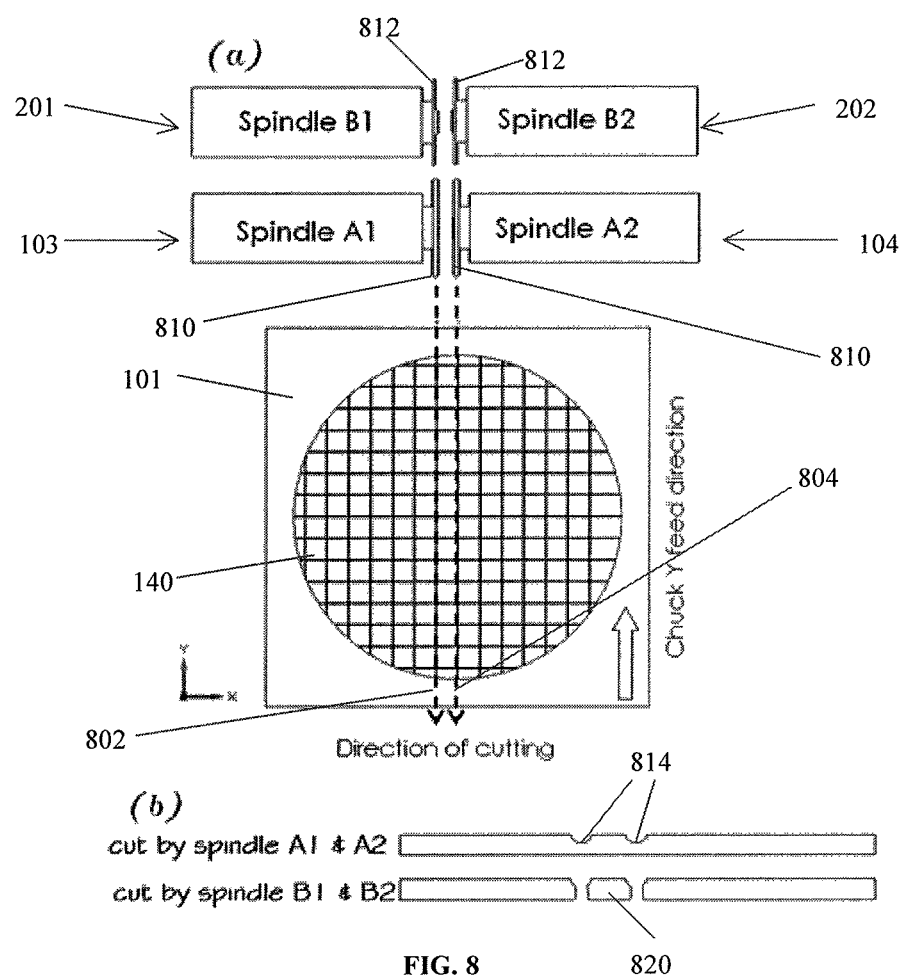
FIG. 8 schematically depicts a step or bevel cutting method using a quad cutting means.

Turning now to FIG. 8, a cutting method for step or bevel cutting with a quad cutting means is illustrated. In applications which require step or bevel cutting, it is possible, with the quad cutting machines 100, 300, 500, to perform the cutting in one feed of the chuck (in the Y direction).

In FIG. 8(a), workpiece 140 is loaded and secured to the chuck station 101, and the chuck station 101 moves in the Y direction towards first cutting means 103, 104 and second cutting means 201, 202, (only the spindles and blades of which are shown for clarity). The first and second cutting means are aligned such that their respective blades 810 and 812 are aligned with cutlines 802 and 804 of the workpiece 140.

As the workpiece 140 passes under spindles A1 and A2 of the pair of first cutting members 103 and 104 respectively, face-to-face blades 810 form shallow cuts 814 (i.e., not passing completely through the workpiece 140) along the cutlines 802 and 804, as shown in FIG. 8(b). Then, as the workpiece 140 continues to be fed and reaches blades 812 of the spindles B1 and B2 (of second cutting means 201 and 202), the blades 812 cut all the way through the workpiece 140 at the positions of grooves 814. Blades 812 are thinner than blades 810 such that a shoulder or bevel is formed in the singulated units 820. Accordingly the blades 812 cut the workpiece 140 to a depth that is greater, and by a width that is smaller, than that of the blades 810. Nevertheless, it should be appreciated that the blades 810, 812 may also cut the workpiece 140 along four different cutlines in a single feed of the chuck station 101.

Embodiments of the invention may have one or more of the following advantages:

The quad cutting means dual chuck station configuration 100 or 300 is more efficient than previously known machines with dual chuck stations. It reduces the chance of idling when cutting small (unit) size packages and hence increases overall throughput.

The machines 100, 300 can be readily reconfigured so that all four cutting members of the quad cutting means serve one single chuck. With use of suitable blades, this can provide two types of cutting (e.g. step and through cut) with a single feed of the chuck table, and thus result in less offset of the cut lines made by the different types of cutting, if the front cutting means are aligned along the same cutting lines as the back cutting means.

If the four cutting members are positioned at four different cutlines, along the same workpiece, the throughput can be increased.

Various modifications and variations of the above embodiments are possible without departing from the scope of the invention. For example, although embodiments with two chuck stations and two pairs of cutting members are described, it will be appreciated that those embodiments may be readily extended to include three or more chuck stations and/or three or more pairs of cutting members. One pair of cutting members may be provided for each chuck station, for example.

The invention claimed is:

1. A singulation apparatus, comprising:
at least one chuck station to which one or more workpieces are securable, the at least one chuck station being configured to move along a feed direction;
a bridge extending above the at least one chuck station, the bridge having a first side and a second side opposite the first side;
a first cutting device mounted to the bridge and being independently movable along the first side, transversely to the feed direction, wherein the first cutting device comprises a first cutting member and second cutting member movably mounted on the first side of the bridge; and
a second cutting device mounted to the bridge and being independently movable along the second side, transversely to the feed direction, wherein the second cutting device comprises a third cutting member and a fourth cutting member movably mounted on the second side of the bridge,
each of the first, second, third, and fourth cutting members being configured and arranged to be independently movable with respect to one another for cutting the one or more workpieces.

2. The singulation apparatus according to claim 1, wherein the bridge comprises a first bridge member to which the first cutting device is mounted, and a second bridge member to which the second cutting device is mounted, the second bridge member being separated from the first bridge member.

3. The singulation apparatus according to claim 1, wherein each of the first and second cutting devices comprises a plurality of cutting members.

4. The singulation apparatus according to claim 3, wherein the plurality of cutting members of each of the first and second cutting devices are arranged in one or more pairs, wherein each pair of cutting members comprises blades, wherein the blades of the pair of cutting members or the blades of each pair of cutting members face each other to cut the workpiece along the feed direction.

5. The singulation apparatus according to claim 4, wherein the total number of pairs of cutting members of the first and second cutting devices is equal to the number of chuck stations.

\* \* \* \* \*